(12) United States Patent
Tabata et al.

(10) Patent No.: US 10,676,825 B2
(45) Date of Patent: Jun. 9, 2020

(54) GAS JETTING APPARATUS FOR FILM FORMATION APPARATUS

(71) Applicant: Toshiba Mitsubishi-Electric Industrial Systems Corporation, Chuo-ku (JP)

(72) Inventors: Yoichiro Tabata, Tokyo (JP); Kensuke Watanabe, Tokyo (JP); Shinichi Nishimura, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 365 days.

(21) Appl. No.: 15/514,367

(22) PCT Filed: Oct. 29, 2014

(86) PCT No.: PCT/JP2014/078722
§ 371 (c)(1),
(2) Date: Mar. 24, 2017

(87) PCT Pub. No.: WO2016/067379
PCT Pub. Date: May 6, 2016

(65) Prior Publication Data
US 2017/0275758 A1    Sep. 28, 2017

(51) Int. Cl.
*C23C 16/455* (2006.01)
*C23C 16/503* (2006.01)
(Continued)

(52) U.S. Cl.
CPC .......... *C23C 16/45561* (2013.01); *B01J 4/00* (2013.01); *C23C 16/045* (2013.01);
(Continued)

(58) Field of Classification Search
CPC ......... C23C 16/45563–4557; C23C 16/45585; C23C 16/503; C23C 16/513; B01J 4/00; H05H 1/24
(Continued)

(56) References Cited

U.S. PATENT DOCUMENTS 3,850,679 A    11/1974 Spoko et al.
5,643,394 A    7/1997 Maydan et al.
(Continued)

FOREIGN PATENT DOCUMENTS

JP    49-89717    8/1974
JP    5-152350 A    6/1993
(Continued)

OTHER PUBLICATIONS

Office Action dated Jan. 9, 2018 in Japanese Patent Application No. 2016-556093 (with partial English language translation) 8 pages.
(Continued)

*Primary Examiner* — Elizabeth A Burkhart
(74) *Attorney, Agent, or Firm* — Xsensus LLP

(57) ABSTRACT

The gas jetting apparatus according to the present invention includes a gas jetting cell unit for rectifying a gas and jetting the rectified gas into the film formation apparatus. The gas jetting cell unit has a fan shape internally formed with a gap serving as a gas route. A gas in a gas dispersion supply unit enters from a wider-width side of the fan shape into the gap, and, due to the fan shape, the gas is rectified, accelerated, and output from a narrower-width side of the fan shape into the film formation apparatus.

14 Claims, 9 Drawing Sheets

(51) Int. Cl.
  *H01L 21/31* (2006.01)
  *H05H 1/24* (2006.01)
  *B01J 4/00* (2006.01)
  *C23C 16/04* (2006.01)
  *C23C 16/452* (2006.01)
  *C23C 16/513* (2006.01)

(52) U.S. Cl.
  CPC .......... *C23C 16/452* (2013.01); *C23C 16/455* (2013.01); *C23C 16/4551* (2013.01); *C23C 16/4557* (2013.01); *C23C 16/45559* (2013.01); *C23C 16/45563* (2013.01); *C23C 16/45572* (2013.01); *C23C 16/45582* (2013.01); *C23C 16/503* (2013.01); *C23C 16/513* (2013.01); *H01L 21/31* (2013.01); *H05H 1/24* (2013.01)

(58) Field of Classification Search
  USPC ....................................................... 118/723 E
  See application file for complete search history.

(56) References Cited

U.S. PATENT DOCUMENTS

| | | | |
|---|---|---|---|
| 6,419,752 | B1 | 7/2002 | Shvets et al. |
| 2003/0047282 | A1 | 3/2003 | Sago et al. |
| 2003/0057848 | A1 | 3/2003 | Yuasa et al. |
| 2004/0199499 | A1 | 10/2004 | Lazaridis et al. |
| 2007/0012249 | A1 | 1/2007 | Miyazawa |
| 2008/0053614 | A1 | 3/2008 | Sago et al. |
| 2008/0156440 | A1 | 7/2008 | Sago et al. |
| 2009/0035951 | A1* | 2/2009 | Miya .................. C23C 16/405 438/787 |
| 2009/0173444 | A1 | 7/2009 | Sago et al. |
| 2009/0188626 | A1 | 7/2009 | Lu et al. |
| 2010/0193129 | A1* | 8/2010 | Tabata .................. C23C 16/505 156/345.35 |
| 2013/0115780 | A1* | 5/2013 | Okumura ................ H05H 1/30 438/710 |
| 2014/0199500 | A1 | 7/2014 | van Kessel et al. |

FOREIGN PATENT DOCUMENTS

| | | |
|---|---|---|
| JP | 7-29827 A | 1/1995 |
| JP | 2000-183045 A | 6/2000 |
| JP | 2001-135628 A | 5/2001 |
| JP | 2004-111739 A | 4/2004 |
| JP | 2004-307892 | 11/2004 |
| JP | 2007-266489 A | 10/2007 |

OTHER PUBLICATIONS

Combined Office Action and Search Report dated Nov. 2, 2018 in Chinese Patent Application No. 201480082990.6 (with English language translation).

European Office Action dated Nov. 23, 2018 in Patent Application No. 14 905 132.8.

Office Action dated Aug. 8, 2018 in Korean Patent Application No. 10-2017-7010043 (with English translation).

Office Action dated Sep. 5, 2017 in Japanese Patent Application No. 2016-556093 (with partial English language translation).

Taiwanese Office Action dated Sep. 9, 2016 in corresponding Taiwanese Application No. 104133835 (with partial English translation).

International Search Report dated Jan. 20, 2015 in PCT/JP2014/078722 filed Oct. 29, 2014.

International Preliminary Report on Patentability and Written Opinion dated May 11, 2017 in PCT/JP2014/078722 (with English Translation).

Extended Search Report dated May 4, 2018 in European Patent Application No. 14905132.8.

European Office Action dated Jun. 25, 2019 in Patent Application No. 14 905 132.8, 7 pages.

* cited by examiner

F I G. 1
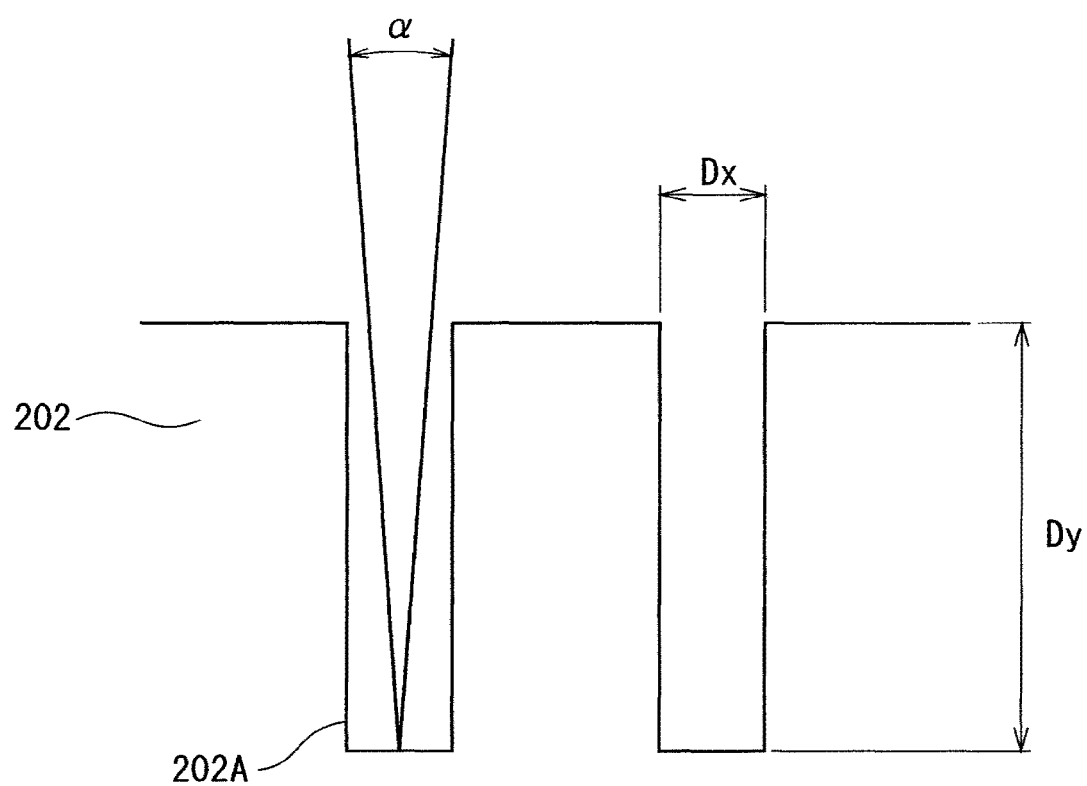

GAS JETTING APPARATUS FOR FILM FORMATION APPARATUS

TECHNICAL FIELD

The present invention relates to a gas jetting apparatus for a film formation apparatus, and is applicable, for example, a gas jetting apparatus capable of jetting out at a higher velocity having directivity various gases useful for treatment of a treatment-target object placed under a reduced pressure atmosphere in a treatment chamber.

BACKGROUND ART

In various application fields including a semiconductor manufacturing field, multi-function, high quality thin films (for example, high insulation thin films, semiconductor thin films, high dielectric thin films, light-emitting thin films, high magnetic thin films, and super-hard thin films) have been demanded.

For example, in scenes of manufacturing semiconductor apparatuses, semiconductor chips are formed with, for example, a high conductive film having a lower impedance so as to correspond to circuit wiring, a high magnetic film having a circuit wiring and coil function and a magnetic function, a high dielectric film having a circuit capacitor function, and a high insulation film having a high insulation function with less-electrical leakage current.

As conventional technologies for forming these films, for example, thermal Chemical Vapor Deposition (CVD) apparatuses, optical CVD apparatuses, and plasma CVD apparatuses have been used, in particular, a plasma CVD apparatus has often been used. Because a plasma CVD apparatus is superior, than thermal and optical CVD apparatuses, in film formation treatment capability at a lower film formation temperature and at a higher film formation velocity in a shorter period of time, for example.

For example, when a gate insulating film such as a nitride film (SiON, HfSiON, etc.) or an oxide film ($SiO_2$, $HfO_2$) is formed onto a semiconductor substrate, a technology using a plasma CVD apparatus under a reduced pressure atmosphere as described below is widely used.

That is, a gas such as $NH_3$ (ammonia), $N_2$, $O_2$, and $O_3$ (ozone), and a precursor gas (non-heated gas) such as silicon and hafnium are directly supplied into a treatment chamber apparatus in which a CVD treatment will be implemented. In the treatment chamber apparatus, the precursor gas is dissociated through heat or a discharge of electricity to produce metallic particles, and then, through a chemical reaction between the metallic particles and the above described non-heated gas such as $NH_3$ (ammonia) or a radical gas generated using heat or a discharge of electricity, a thin film such as a nitride film or an oxide film is formed onto a treatment-target object.

On the other hand, in a plasma CVD apparatus, high frequency plasma or microwave plasma is directly generated in a treatment chamber apparatus. Therefore, a treatment-target object is exposed to a radical gas or high energy plasma ions (or electrons).

As a prior art document disclosing a technology relating to a plasma CVD apparatus, for example, Patent Document 1 exists.

However, in a film formation treatment performed in a plasma CVD apparatus, as described above, a treatment-target object is directly exposed to plasma. Therefore, the treatment-target object is often damaged by the plasma (ions and electrons), thus a performance of a semiconductor function has been significantly lowered.

On the other hand, in a film formation treatment using a thermal or optical CVD apparatus, a treatment-target object is free from damage by plasma (ions and electrons), and is formed with a high quality nitride film, an oxide film, or another film. However, in the film formation treatment, it is difficult to obtain a high density, large amount radical gas source, and, as a result, a film formation requires an extremely longer period of time.

Recent thermal and optical CVD apparatuses use, as a source gas, a high density $NH_3$ gas or $O_3$ gas that easily dissociates by heat or irradiated light. In addition, in a CVD chamber apparatus, a heating catalyst carrier is provided. Therefore, with the thermal and optical CVD apparatuses, a catalytic action facilitates gas dissociation, thus a nitride film, an oxide film, or another film can be formed in a shorter period of time. However, the shortened period of time is limited, thus significant improvement in film formation has been difficult.

As a apparatus capable of reducing damage to a treatment-target object due to plasma, and further shortening a period of time for film formation, a remote plasma type film formation treatment system exists (for example, see Patent Document 2).

In a technology according to Patent Document 2, a plasma generating area and a treatment-target material treating area are separated by a partition (plasma confinement electrode). Specifically, in the technology according to Patent Document 2, the plasma confinement electrode is provided between a high frequency applying electrode and an opposite electrode to which a treatment-target object is placed. Therefore, in the technology according to Patent Document 2, only neutral active species are supplied onto the treatment-target object.

In addition, in the technology according to Patent Document 3, in a remote plasma source, a source gas is partially activated by plasma. In here, a gas flow channel is surrounded in the remote plasma source. An activated gas generated in the remote plasma source is discharged and supplied toward an apparatus in which a treatment-target object is present.

With the thin film technology described in Patent Document 3, various source gases are used, such as nitrogen, oxygen, ozone, and hydrogen. From the source gas, an activated radical gas is generated, and, by the radical gas, a thin film is formed onto a treatment-target object.

The radical gas is highly reactive. Therefore, by allowing a radical gas at a trace concentration (approximately 1%: 10000 ppm) in maximum to come into contact with a treatment-target object, a chemical reaction is facilitated between metallic particles and the radical gas on the treatment-target object, thus a nitride thin film, an oxide thin film, or a hydrogen bonding thin film can effectively be formed in a short period of time.

A radical gas generating apparatus is provided with a discharge cell to achieve, in the discharge cell, higher electrical field plasma through dielectric barrier discharge becoming atmospheric pressure plasma. Therefore, from the source gas exposed to plasma in the discharge cell, a high quality radical gas is generated and supplied to a CVD apparatus.

In addition, in a CVD apparatus, when a treatment using a gas is to be implemented for a treatment-target object (wafer substrate), the CVD apparatus provided with the treatment-target object is internally heated and decompressed. In the CVD apparatus, an organic metallic compound steam gas (precursor gas) is filled, and, for facilitating oxidation, nitriding, and reduction of metallic particles, an ozone gas, water vapor, a hydrogen gas, or a radical gas (an oxygen radical gas, a nitrogen radical gas, a hydrogen radical gas, or another gas) is supplied. Therefore, in the CVD apparatus, by allowing oxidation substances, nitride substances, and other substances accumulated on the treatment-target object surface to thermally diffuse, a film (formed film) can crystal grow to serve as a function film such as a semiconductor film, an insulating film, or another film on the treatment-target object surface.

Each of various gases (ozone gas, water vapor, hydrogen gas, or radical gas) to be supplied into the CVD apparatus together with a precursor gas as described above is hereinafter referred to as a film formation treatment gas.

PRIOR ART DOCUMENTS

Patent Documents

Patent Document 1: Japanese Patent Application Laid-Open No. 2007-266489
Patent Document 2: Japanese Patent Application Laid-Open No. 2001-135628
Patent Document 3: Japanese Patent Application Laid-Open No. 2004-111739

SUMMARY OF INVENTION

Problems to be Solved by the Invention

Conventionally, to configure a function element (2D (dimension) element) such as a semiconductor on a treatment-target object, surface film formation through which a precursor gas or a film formation treatment gas is filled in a CVD treatment vessel has mainly been used.

For example, in a decompressed CVD apparatus in which a treatment-target object or a plurality of treatment-target objects is provided, a gas is showered and jetted out, via a plurality of nozzle holes, from a shorter gas supply pipe having a predetermined bore. Since the gas supplied from the shorter gas supply pipe having the predetermined bore is jetted out without fully rectified to a gas having predetermined directivity and fully accelerated as a supply gas having a higher velocity, the jetted out gas is diffused all around at a diffusion velocity that depends on an atmosphere gas pressure and a gas density difference.

On the other hand, due to demands of further higher dense function elements, three dimensional function elements (3D (dimension) elements) formed laminated with a plurality of function elements have been demanded. That is, uniformly forming into a high-aspect-ratio groove a desired film has been demanded.

However, as described above, when a gas is diffused and jetted all around, the gas is not uniformly radiated in the high-aspect-ratio groove. Under this condition, a uniform film cannot be formed in the groove.

Therefore, for a treatment-target object, a film formation technology capable of uniformly jetting a gas into a high-aspect-ratio groove has been demanded.

The present invention has an object to provide a gas jetting apparatus for a film formation apparatus. The gas jetting apparatus is capable of uniformly jetting, even onto a treatment-target object having a high-aspect-ratio groove, a gas such as $NH_3$ (ammonia), $N_3$, $O_2$, and $O_3$ (ozone), a precursor gas (non-heated gas) such as silicon and hafnium, and a gas radicalized through heating and a discharge of electricity into the groove.

Means for Solving the Problems

To achieve the above described object, a gas jetting apparatus for a film formation apparatus, according to the present invention, includes a gas supply unit for supplying a gas, a gas dispersion supply unit for accepting the gas supplied from the gas supply unit, and a gas jetting cell unit for accepting the gas dispersed in the gas dispersion supply unit, rectifying the gas, and jetting the rectified gas into the film formation apparatus. The gas jetting cell unit has a fan shape internally formed with a gap serving as a gas route. The gas in the gas dispersion supply unit enters from a wider-width side of the fan shape into the gap, and, due to the fan shape, the gas is rectified, accelerated, and output from a narrower-width side of the fan shape into the film formation apparatus.

Effects of the Invention

A gas jetting apparatus for a film formation apparatus, according to the present invention includes a gas supply unit for supplying a gas, a gas dispersion supply unit for accepting the gas supplied from the gas supply unit and dispersing the gas, and a gas jetting cell unit for accepting the gas dispersed in the gas dispersion supply unit, rectifying the gas, and jetting the rectified gas into the film formation apparatus. The gas jetting cell unit has a fan shape internally formed with a gap serving as a gas route. The gas in the gas dispersion supply unit enters from a wider-width side of the fan shape into the gap, and, due to the fan shape, the gas is rectified, accelerated, and output from a narrower-width side of the fan shape into the film formation apparatus.

Therefore, a gas passed through the gap in the gas jetting cell unit can be rectified in a predetermined direction, accelerated, output, and jetted as a gas in a beam shape having directivity from the gas jetting apparatus. Therefore, the gas jetting apparatus according to the present invention can uniformly jet, even onto a treatment-target object having a high-aspect-ratio groove, the gas into the groove, and, as a result, a uniform film can be formed in the groove.

BRIEF DESCRIPTION OF DRAWINGS

FIG. 1 is an enlarged sectional view illustrating a cross-sectional configuration of a part of a treatment-target object 202 having a high-aspect-ratio groove 202A.

DESCRIPTION OF EMBODIMENTS

FIG. 1 is an enlarged sectional view illustrating a cross-sectional configuration of a part of a treatment-target object 202 having a high-aspect-ratio groove 202A.

In FIG. 1, Dx represents a bore of a groove 202A, while Dy represents a depth of the groove 202A. For example, the bore Dx has a diameter of approximately several ten μm, while the depth Dy has a value in a range from approximately several times to several ten times of the bore Dx. For the high-aspect-ratio (Dy/Dx) groove 202A shown in FIG. 1, uniform film formation is required (in other words, with gas jetting, the gas should uniformly be supplied to a bottom of the high-aspect-ratio groove 202A).

A conventional method for jetting a gas from a shorter gas supply pipe having a predetermined bore is appropriate for uniformly and fully filling the gas inside an apparatus. However, with the gas jetting out method, in the gas supply pipe, in supplying (jetting out) a gas to a film formation apparatus, neither the gas is fully rectified into a streamlined flow direction nor the gas is fully accelerated, which results in weak directivity of the jetted out gas and a lower gas velocity, that is, the gas does not fully enter into the high-aspect-ratio groove 202A internally, and it is difficult to uniformly form a film onto a bottom surface and a side surface of the groove 202A. In addition, a gas life of the supplied radical gas is extremely shorter, and the gas could disappear before the gas reaches the bottom surface of the groove 202A, thus it is difficult to uniformly form a film.

Therefore, to uniformly form a film in a high-aspect-ratio groove 202A, it is necessary to limit a gas supply space to a thinner gap d0 to fully maintain a spatial distance Lx along which a gas passes through so that the jetted out gas has directivity, as well as to reduce a width of the gas supply space along a flow of the gas passing through to accelerate the rectified gas to a higher gas velocity. That is, it is necessary that the more an aspect ratio of the groove 202A is, the less a beam angle α of a jetted-out gas is (i.e. such gas jetting which allows a gas to flow at a higher velocity having strong directivity so that the jetted-out gas overcomes a diffusion velocity and the gas is prevented from being expanded is required).

As for a gas jetting apparatus for jetting non-heated, heated, and discharge gases into a film formation apparatus, according to the present invention, a configuration capable of jetting out a precursor gas or a film formation treatment gas in a beam shape in order to uniformly form a film in a high-aspect-ratio groove 202A will now be described herein. The present invention will now specifically be described herein with reference to the drawings illustrating its exemplary embodiments.

First Exemplary Embodiment

Figure 2:
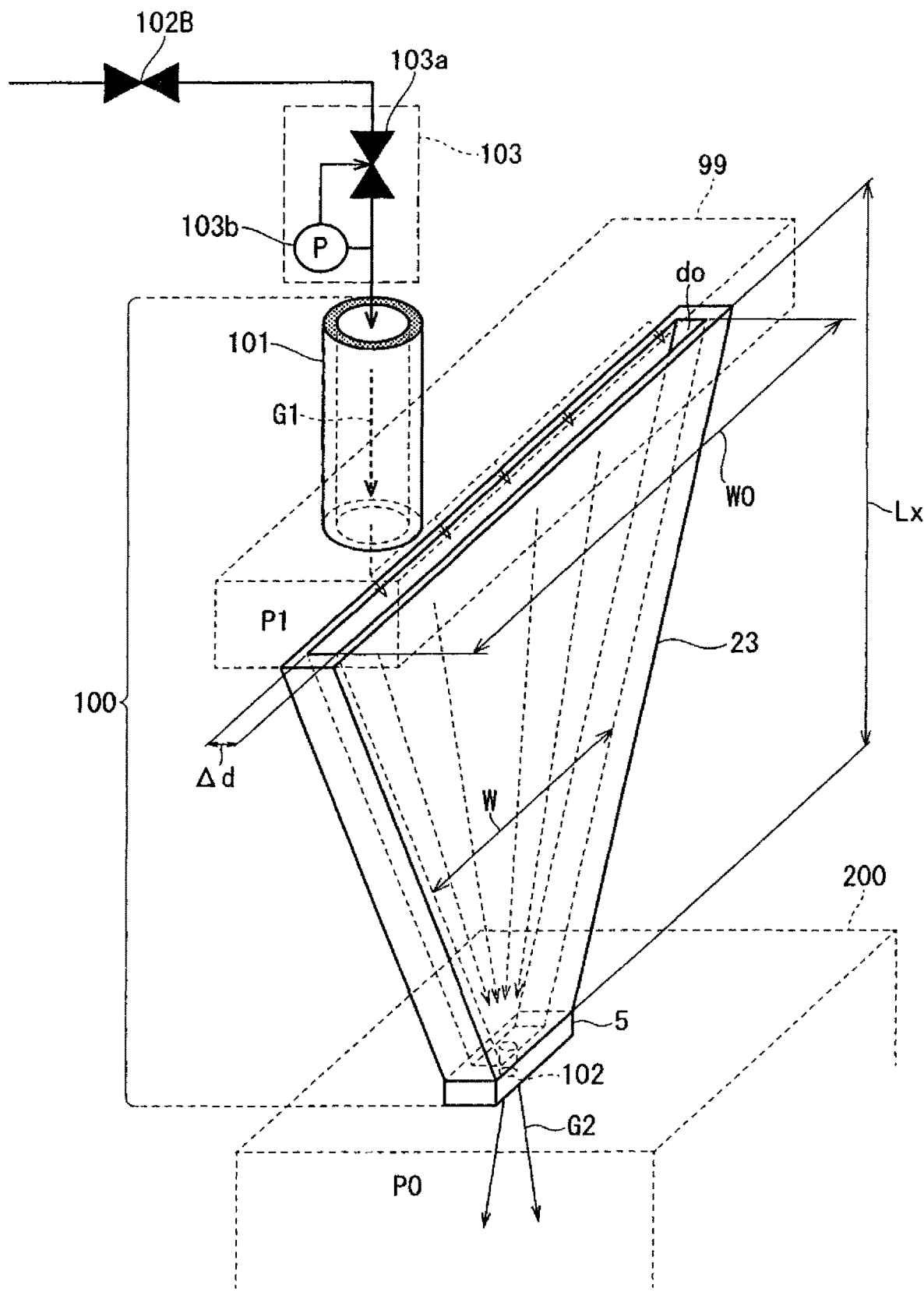
FIG. 2 is a perspective view schematically illustrating a configuration of a remote plasma type film formation treatment system configured to include a gas jetting apparatus 100 and a treatment chamber 200 according to a first exemplary embodiment.

FIG. 2 is a perspective view schematically illustrating a configuration of a remote plasma type film formation treatment system configured to include a gas jetting apparatus 100 for jetting non-heated, heated, and discharge gases into a film formation apparatus (hereinafter simply referred to as a gas jetting apparatus) and a treatment chamber 200, according to this exemplary embodiment.

Gas jetting apparatus 100 and the treatment chamber 200 are partitioned by a flange. That is, the flange is a member for joining the gas jetting apparatus 100 and the treatment chamber 200, where a main surface of the flange configures a bottom surface of the gas jetting apparatus 100, while another main surface of the flange configures a top surface of the treatment chamber 200. In here, the gas jetting apparatus 100 and the treatment chamber 200 are internally coupled each other via a jetting-out hole 102.

As shown in FIG. 2, the gas jetting apparatus 100 is configured to include in a sealed manner a gas supply unit 101, a gas dispersion supply unit 99, a gas jetting cell unit 23, and a gas jetting unit 5. In the gas dispersion supply unit 99, a gas supplied from the gas supply unit 101 uniformly disperses. In the gas jetting cell unit 23, the dispersed gas supplied from the gas dispersion supply unit 99 is rectified in a flow direction, and accelerated. In the gas jetting cell unit 23, the gas rectified and accelerated at a higher velocity is sent to the gas jetting unit 5. In here, the gas jetting unit 5 is provided with a hole 102 for jetting out a gas toward the film formation apparatus.

At a previous stage of the gas jetting apparatus 100, a valve 102B for adjusting an amount of a gas to be supplied, and a pressure controlling unit 103 for monitoring gas pressure in the gas jetting apparatus 100 to control the gas pressure in a predetermined range are provided. A gas G1 supplied from the gas supply unit 101 is uniformly supplied by the gas dispersion supply unit 99 into a gas gap d0 that is a gas supply cross-section of the gas jetting cell unit 23. In here, gas pressure P1 in the gas jetting apparatus 100 is kept constant to a value in a range from 10 kPa to 50 kPa inclusive. In addition, the gas passed through the gas jetting cell unit 23 is jetted out as a jetted-out gas G2 via the jetting-out hole 102 of the gas jetting cell 5. This gas G2 is jetted into the treatment chamber 200 (more specifically, jetted toward a treatment-target object 202 in the treatment chamber 200). In here, an opening size of the jetting-out hole 102 is, for example, 1 mm or smaller.

Although pressure inside the gas jetting apparatus 100 is reduced to pressure P1, pressure outside the gas jetting apparatus 100 is atmospheric pressure.

Inside the treatment chamber 200 that is a CVD apparatus, a table is provided. On the table, the treatment-target object is placed. In here, the treatment-target object has, as shown in FIG. 1, a high-aspect-ratio 202A.

The treatment chamber 200 is coupled with a vacuum pump via an evacuation port. The vacuum pump maintains gas pressure P0 in the treatment chamber 200 to pressure reduced to a vacuum pressure value in a range from approximately 30 Pa to 400 Pa.

In FIG. 2, a precursor gas or a source gas G1 that can be regarded as a radical gas is supplied, via the gas supply unit 101, into gas jetting cell unit 23 at a predetermined flow rate. The source gas G1 uniformly dispersed in the gas jetting cell unit 23 is uniformly supplied into the gap d0 of the gas jetting cell unit 23. The source gas G1 passes through the gas jetting cell unit 23, and is jetted out as a precursor gas G2 or a radical gas G2 from the jetting-out hole 102 into the treatment chamber 200. The gas G2 is radiated in a beam shape toward the treatment-target object placed on the table to form a film on a radiated area.

In below descriptions, the gas jetting cell unit 23 has a hollow, flat plate shape, and is also a fan shape where a cross-sectional shape at a hollow, gas flow portion has a rectangular section, and, in a gas flow direction, a gas flow width in the rectangular section decreases. A flow of a gas in the gas jetting cell unit 23 will now be described herein.

In here, a portion of the gas jetting cell unit 23 is made of, for example, sapphire or quartz. In addition, a width (a distance between two fan-shaped flat plates configuring the gas jetting cell unit 23) Δd of the gas gap do is limited to a maximum of 3 mm. In addition, since gas pressure P1 in the gas jetting apparatus 100 is kept constant to a value in a range from 10 kPa to 50 kPa inclusive, gas pressure in the gap do is also kept constant to a value in a range from 10 kPa to 50 kPa inclusive.

With the gas jetting apparatus 100, where, as described above, a gas flow cross-section is limited to the width Δd of the gap do to make a rectangular cross-sectional shape (fan shape) where a gas flow width W is reduced in a gas flow direction, and where gas pressure is reduced to P1, a gas is supplied at a flow rate Q to the gas jetting apparatus 100. (This gas flow rate Q is specified to, for example, 1 L/min.) By allowing a gas that flows into the gas jetting cell unit 23 to pass through a predetermined gas space Lx, as represented by a next equation (1), the gas is rectified and accelerated to a flow velocity $V_{So}$, thus the gas is rectified into a gas flow in a predetermined direction at a peak portion of the gas jetting cell unit 23. In addition, by allowing the gas to pass through the gas jetting cell unit 23, the gas is accelerated to a higher velocity, as a higher velocity $V_S$, thus the gas is jetted out from the jetting-out hole 102.

In here, the equation (1) is $V_{So}=100/P1 \cdot [1000 \cdot Q/\{(W/10) \cdot (\Delta d/10)\}]$ (cm/s).

Figure 4:
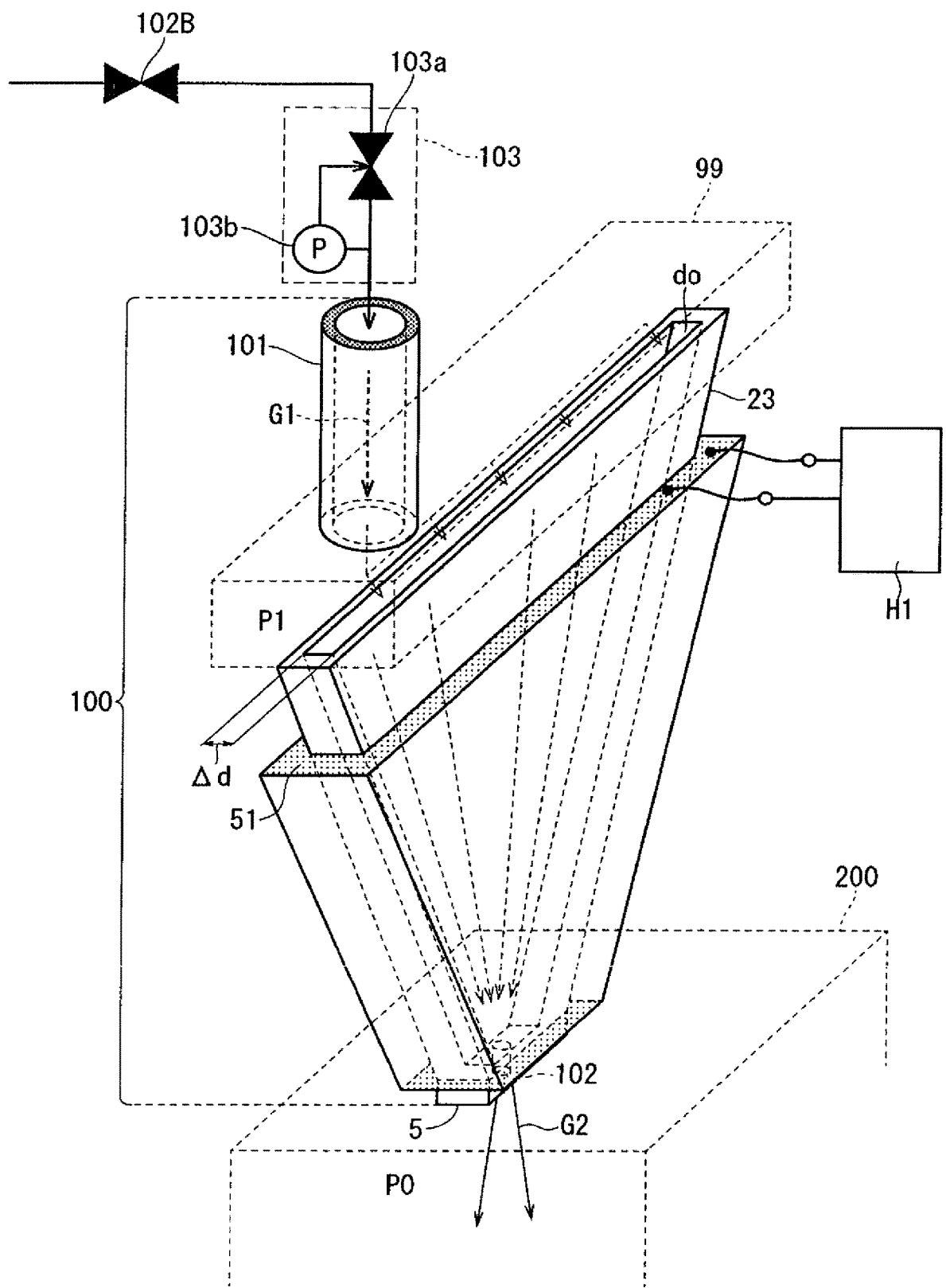
FIG. 4 is a perspective view schematically illustrating a configuration of a gas jetting apparatus 100 according to a second exemplary embodiment.

The gas G1 passed through the narrow gap do at a length Lx, and then flowed from all around into the gas jetting cell unit 23 is, in a gas flow direction, due to the fan-shaped gas space, rectified in a constant direction of a flow of the gas (inwardly), and accelerated. The gas is jetted, as the gas G2, from an apex side of the gas jetting cell unit 23 (i.e. via the jetting-out hole 102 of the jetting-out unit 5) toward the treatment-target object (in other words, jetted into the treatment chamber 200 in which pressure is maintained to the gas pressure P0). In here, as shown in FIG. 4, the gas G2 that is jetted from the gas jetting cell unit 23 forms a beam shape having a beam angle α.

A route distance Lx in the gap do is set to at least a value of several ten times of the width Δd of the gap do, for example, to a value in a range from 20 mm to 100 mm inclusive. Even if directions of flows of a gas entering into the gap do of the gas jetting cell unit 23 differ, the directions of the flows of the gas at a peak side of the gas jetting cell unit 23 (i.e. around the jetting-out unit 5) are streamlined and rectified in a direction along the side surfaces of the gas jetting cell unit 23. In addition, due to the shape of the gas jetting cell unit 23, a cross-sectional area of the rectangular gas gap do gradually reduces toward the jetting-out unit 5. Therefore, the gas flowing in the gas jetting cell unit 23 is accelerated (at acceleration a) to the velocity Vs at around the jetting-out unit 5.

The gas rectified, accelerated to the velocity Vs, and entered into the jetting-out unit 5 is further compressed and accelerated at the jetting-out hole 102. In here, at the jetting-out hole 102, a pressure difference ΔP (=the gas pressure P1 in the gas jetting apparatus 100—the gas pressure P0 in the treatment chamber 200) is generated, and the pressure difference ΔP is utilized to jet the gas G2 from the jetting-out hole 102 into the treatment chamber 200.

In here, a velocity of a gas entered from the peak portion of the gas jetting cell unit 23 into the jetting-out unit 5 is specified to Vs, an axial direction component of the velocity Vs is specified to Vsy, and a diameter direction component of the velocity Vs is specified to Vsx. In addition, a velocity of a gas output from the jetting-out unit 5 is specified to V0, an axial direction component of the velocity V0 is specified to Vy0, and a diameter direction component of the velocity V0 is specified to Vx0.

Where, a velocity V0 of a gas jetting out into the treatment chamber (film formation apparatus) 200 is increased to a higher velocity due to a ratio between the gas pressure P1 in the gas jetting apparatus 100 and the gas pressure P0 in the film formation apparatus 200 (=P1/P0), that is, velocity V0={(gas pressure P1)/(gas pressure P0)}×velocity Vs, velocity Vy0={(gas pressure P1)/(gas pressure P0)}×velocity Vsy, and velocity Vx0={(gas pressure P1)/(gas pressure P0)}×velocity Vsx.

Since pressure in the treatment chamber 200 is pressure close to vacuum pressure (gas pressure P0=approximately 30 Pa to 400 Pa), a diffusion velocity VD of a gas jetted out from the jetting-out unit 5 significantly increases. Incidentally, the velocity Vs of the gas jetted out toward the treatment-target object increases at the portion of the gas jetting cell unit 23, and, due to the pressure difference ΔP between the gas pressure P1 in the gas jetting apparatus 100 and the gas pressure P0 in the treatment chamber 200, the rectified and accelerated gas is compressed at the jetting-out hole 102 to jet out at a velocity exceeding a supersonic velocity.

Figure 3:
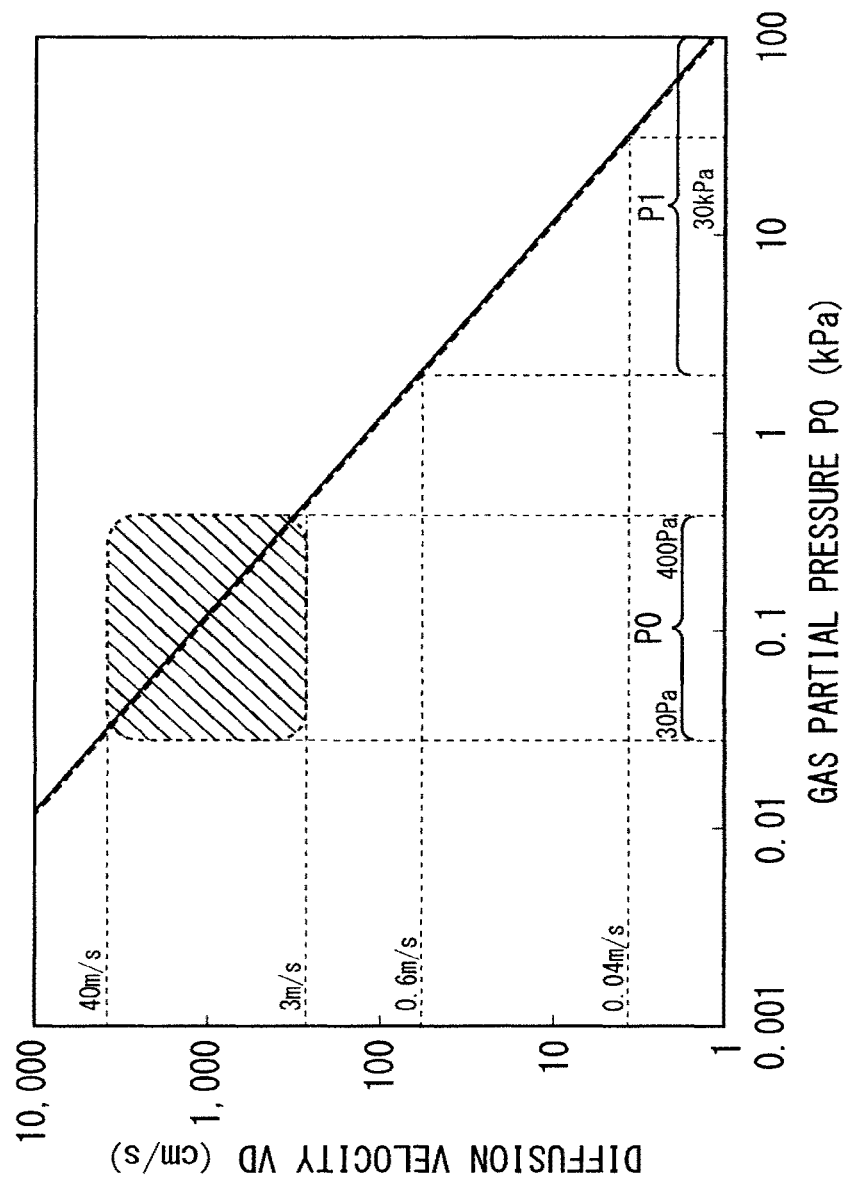
FIG. 3 is a reference graph illustrating a relationship between gas pressure and a gas diffusion velocity of a gas to be supplied.

FIG. 3 is a characteristic diagram illustrating a diffusion velocity VD characteristic at gas pressure P0 at which a gas is supplied, when, as a gas species, an oxygen gas or a nitrogen gas is used. With reference to FIG. 3, at the gas jetting cell unit 23, when P1 is specified to 30 kPa, a diffusion velocity VD of the gas is approximately 0.04 m/s, but, at a gas pressure atmosphere P0 in the treatment chamber, is a value in a range from 3 m/s to 40 m/s inclusive, thus the diffusion velocity VD of the gas is significantly large. Due to the larger diffusion velocity VD in the treatment chamber 200, the gas jetting out into the treatment chamber 200 does not have directivity, thus, when a jet out velocity is not higher enough than a diffusion velocity, a gas jetted out into the treatment chamber 200 immediately diffuses in all directions.

On the other hand, when a gas G2 is jetted out from the fan-shaped gas jetting cell 23 according to the present application invention into the treatment chamber 200, a jetting-out velocity V0 of the beam-shaped, jetted out gas G2 having directivity reaches a velocity exceeding the supersonic velocity. Therefore, compared with the diffusion velocity VD, the gas has a significantly higher gas flow velocity, thus, while the jetted out gas is prevented as much as possible from being diffused all around, the gas can be jetted at a higher velocity and radiated in a beam shape toward a surface of a treatment-target object.

As for a gas jetted out from the jetting-out unit 5, a gas G2 is jetted out at a velocity exceeding the diffusion velocity VD. Therefore, by allowing the gas G2 to jet from the jetting-out unit 5 so as to have further higher velocity Vsy, the gas G2 can be jetted out in a beam shape having directivity from the peak portion of the gas jetting cell unit 23. In addition, since the velocity Vsx has an inward gas velocity vector, due to a fan shape of the gas jetting cell, the jetted out gas will also have an effect to have an inward gas velocity vector Vx0, which is a direction toward which a diffusion velocity VD lowers.

The inventors have found that, as results of experiments and simulations, when gas pressure P0 in the treatment chamber 200 is set to an appropriate film formation value in a range from approximately 30 Pa to 400 Pa inclusive, in a view point of directivity of a gas G2, an advantageous acceleration of the gas at around the jetting-out unit 5 is at least approximately 200 m/s2. In addition, to jet out a further high quality gas G2 in a beam shape, an advantageous acceleration of the gas G2 is at least approximately 400 m/s2.

Therefore, the inventors have found that, in the gas jetting cell unit 23 with which an arc angle of the above described gas jetting cell unit 23 is set to a value in a range from around approximately 20° to 40°, in a view point of securing the above described acceleration, advantageous gas pressure P1 in the jetting cell unit 23 is a maximum of approximately 80 kPa, and, to jet out a further high quality gas G2 in a beam shape, further advantageous gas pressure P1 is a maximum of approximately 50 kPa.

On the other hand, it is advantageous that a pressure loss of at least several ten times of gas pressure P0 (30 Pa to 400 Pa) in the treatment chamber 200 is maintained. In the jetting-out unit 5, when a diameter of the jetting-out hole 102 is specified to a value in a range from 0.03 mm to 1 mm inclusive, while a length L1 of the jetting-out unit 5 is specified to at least 5 mm, advantageous gas pressure P1 in the gas jetting cell unit 23 is approximately 20 kPa.

Although the gas jetting apparatus 100 is configured to be able to jet a rectified gas as a gas to be jet at a higher velocity, the gas jetting apparatus 100 does not have means of controlling gas pressure in the gas jetting apparatus 100. Therefore, if gas pressure in the gas jetting apparatus 100 fluctuates, an amount of a gas to be jetted out and a velocity of the gas to be jetted out fluctuate, thus, in the film formation apparatus, quality of a film to be formed is affected. In addition, if gas pressure P0 in the treatment chamber 200 in the film formation apparatus fluctuates, for example, if pressure fluctuates in a range from 30 Pa to 400 Pa inclusive, in response to the gas pressure P0 in the treatment chamber 200, gas pressure in the gas jetting apparatus 100 fluctuates.

In the present invention, to control a fluctuation in pressure in the gas jetting apparatus 100 and a gas amount, on a gas supply side of the gas jetting apparatus 100, gas flow rate adjusting means, gas pressure constant control means, and means for monitoring pressure such that the pressure falls within a predetermined pressure range are provided.

In FIG. 2, in order to control a fluctuation in pressure in the gas jetting apparatus 100 and a gas amount, at the previous stage of the gas jetting apparatus 100, the valve 102B for adjusting a gas flow rate is provided. In addition, at a next stage of the valve 102B, an auto-pressure controller (APC) 103 is provided. That is, with the valve 102B and the APC 103, pressure in the gas jetting apparatus 100 is controlled to a constant value.

In the APC 103, a pressure gauge 103b constantly measures pressure in the gas jetting apparatus 100. To keep the measured values constant, an automatic open-close valve 103a in the APC 103 is finely adjusted and open-close controlled. Therefore, a gas flow rate and pressure in the gas jetting apparatus 100 are controlled and kept constant.

As described above, by providing the valve 102B and the APC 103 at the previous stage of the gas jetting apparatus 100, quality of a film to be formed in the film formation apparatus can be improved.

To allow a gas to be jetted out in a superior beam shape from the gas jetting apparatus 100, the gas jetting cell unit 23 may advantageously be increased in size. In addition, the jetting-out unit 5 for jetting out a rectified gas without diffusing the gas with the gas jetting cell unit 23 should advantageously be designed as small as possible in size.

As described above, when a length of the fan shape of the gas jetting cell unit 23 is Lx, at a portion of the gap do, by extending the length Lx fully enough, a flow of a gas is rectified in a constant direction, and, as the gas passes through, the rectified gas accelerates. Therefore, a gas G2 can be jetted in a beam shape having directivity from the gas jetting cell unit 23. Therefore, the gas jetting apparatus 100 for jetting non-heated, heated, and discharge gases into the film formation apparatus can uniformly jet, even onto a treatment-target object having a high-aspect-ratio groove, a gas so as to reach into the groove, and, as a result, a uniform film can be formed in the groove.

In addition, when a length of the fan shape of the gas jetting cell unit 23 is Lx, at the portion of the gap do, a gas can be rectified and accelerated, and, as a result, the gas jetting cell unit 23 can jet a gas G2 at a higher velocity. Therefore, for example, since, even when a gas G2 is a gas containing a shorter life radical gas, the gas can reach a treatment-target object in a shorter period of time, while the high density radical is kept, the radical gas G2 can be radiated toward the treatment-target object. Therefore, onto the treatment-target object, a high quality film can be formed, and, in addition, a film formation temperature can be lowered.

By configuring a gas jetting cell unit 23 into a fan shape (arc angle <180°) to form a gap do served as a gas route, and allowing a gas to flow into the gap do, in the gas jetting cell unit 23, the gas can be rectified (a velocity is generated in a direction cancelling a diffusion velocity VD) and accelerated (the gas G2 is jetted at a higher velocity). Therefore, from the gas jetting cell unit 23, the above described gas G2 having directivity is jetted.

On the other hand, if an arc angle of the gas jetting cell unit 23 is too large, many gas collisions occur in the gap do, thus, when generating a radical gas in the gap do, the radical gas greatly disappears in the gap do. In addition, if an arc angle is too large, an occupation area of the gas jetting cell unit 23 increases. By taking into account these problems, an advantageous maximum arc angle is 60°.

In addition, as long as a width Δd of the gap do is 3 mm or narrower, a rectification in the gas jetting cell unit 23 can fully be achieved. However, the smaller a width Δd of the gap do is, the more a rectification can be improved, thus the gas jetting cell unit 23 can jet a gas G2 at a higher velocity.

In addition, as described above, it is advantageous that a portion, onto which a gas comes into contact, of a member of the gas jetting cell unit 23 is made of sapphire or quartz with which a radical gas is less likely to disappear due to collisions with walls, and that route surfaces are surfaces with less unevenness as much as possible.

Therefore, corroded and other materials due to a gas are less likely to generate on wall surfaces along which the gas passes through. Therefore, impurities should be prevented from being output, excluding a gas G2, from the gas jetting cell unit 23. That is, the gas jetting cell unit 23 can always jet out the high purity gas G2.

Second Exemplary Embodiment

In this exemplary embodiment, in a gas jetting cell unit 23, by heating a gas G1, the gas G1 is served as a radical gas. The gas jetting cell unit 23 according to this exemplary embodiment jets the radical gas G2. FIG. 4 is a view illustrating a configuration of a gas jetting apparatus 100 for jetting a heated gas, according to this exemplary embodiment.

A gas species to be heated to generate a radical gas G2 may be an ozone gas (i.e. in FIG. 4, a gas G1 supplied from the gas supply unit 101 to the gas jetting apparatus 100 is an ozone gas).

Generally, in an ozone generator, dielectric barrier discharge is used to generate an ozone gas. Recently, a technology for forming an oxide film using an ozone gas by supplying a high density ozonized gas, without including a nitrogen gas, in an amount of approximately 400 g/m$^3$ to a CVD apparatus has already been established.

With such a film formation technology, for example, a reduced pressure atmosphere and a heated atmosphere are required inside the CVD apparatus. Into the CVD apparatus, a precursor gas (for example, a silicon organic compound such as TEOS (Tetraetheylorthosilicate)) and a high density ozone gas are alternatively supplied to form an oxide film onto a treatment-target object in the CVD apparatus.

In here, in a process for supplying the precursor gas, metallic Si is thermally dissociated from the silicon organic compound, and, in a process for supplying the ozone gas, the ozone gas is partially thermally dissociated to generate oxygen atoms (an oxygen radical). The oxygen radical has higher oxidizability, and, through an oxidation reaction with thermally dissociated metallic Si, forms a $SiO_2$ film onto the treatment-target object.

The gas jetting cell unit 23 according to this exemplary embodiment generates, from the ozone gas, an oxygen radical gas, and jets out the oxygen radical gas as a gas G2 in a beam shape having directivity.

The gas jetting apparatus 100 described in the first exemplary embodiment and the gas jetting apparatus 100 according to this exemplary embodiment have identical configurations excluding that members described below are added.

As shown in FIG. 4, in this exemplary embodiment, on an outer side surface of the fan-shaped gas jetting cell unit 23, a heater (heating unit) 51 is provided in a ring shape. In this exemplary embodiment, as shown in FIG. 4, the gas jetting apparatus 100 includes a power supply H1 for heating the heater 51.

By heating the heater 51, the fan-shaped gas jetting cell unit 23 is heated to a temperature in a range from approximately several ten ° C. to 100° C. inclusive, and, as a result, a gas space in the gap do of the gas jetting cell unit 23 is internally heated to a temperature in a range from several ten ° C. to 100° C. inclusive. When the ozone gas passes through the heated gap do, the ozone gas thermally dissociates, an oxygen radical gas is generated, and, in a short period of time of a life of the oxygen radical gas before the oxygen radical gas returns to an oxygen gas, a gas G2 containing the oxygen radical gas jets onto a treatment-target object.

A high density ozone gas G1 supplied from the gas supply unit 101 uniformly disperses in the gas dispersion supply unit 99, and then enters into the rectangular-section gas space in the fan-shaped gas gap do having a gas space width W0. Inside the gas space in the gap do heated to a temperature in a range from approximately several ten ° C. to 100° C. inclusive, the ozone gas G1 transmits. The ozone gas being transmitted in the gap do partially thermally dissociates. That is, in the heated gap do, the ozone gas thermally dissociates, thus a large amount of an oxygen radical gas is generated. The oxygen radical gas is supplied into the jetting-out unit 5. Via a jetting-out hole 102, the oxygen radical gas G2 is jetted toward the treatment-target object. In here, as also described in the first exemplary embodiment, from the jetting-out hole 102, the oxygen radical gas G2 is jetted out in a beam shape having directivity.

Although, in the above description, the configuration with the single jetting-out hole 102 is exemplified, a plurality of jetting-out holes 102 may be included (similar to the first exemplary embodiment).

As described above, in this exemplary embodiment, on an outer side of the gas jetting cell unit 23, the heater 51 for heating is provided.

As described above, since the narrower gas space in the gap do can directly be heated with the heater 51, at a lower temperature (in a range from approximately several ten ° C. to 100° C.), an ozone gas can effectively be thermally dissociated, and the dissociated oxygen radical gas can be jetted out by the gas jetting cell unit 23 in a shorter period of time. The jetted-out gas G2 containing the jetted-out oxygen radical gas can be radiated, as a beam having directivity, onto a treatment-target object.

As a jetted-out gas G1, instead of the ozone gas, a nitrogen compound gas or a hydrogen compound gas may be adopted. In these cases, in the heated gap do, through thermal dissociation, a nitrogen radical gas or a hydrogen radical gas is generated. When a nitrogen radical gas G2 is radiated from the gas jetting cell unit 23 toward the treatment-target object, a nitride film is folioed, while, when a hydrogen radical gas G2 is radiated, a hydrogen reduction film (a metallic film in which hydrogen bonding is facilitated) is formed.

In addition, in the gap do of the gas jetting cell unit 23 shown in FIG. 4, as a gas G1, a precursor gas may be allowed to enter. In this case, a heated precursor gas is jetted out in a beam shape from the gas jetting cell unit 23.

In this exemplary embodiment, similar to the first exemplary embodiment, at the previous stage of the gas jetting apparatus 100, the valve 102B and the APC 103 are provided.

Third Exemplary Embodiment

Figure 5:
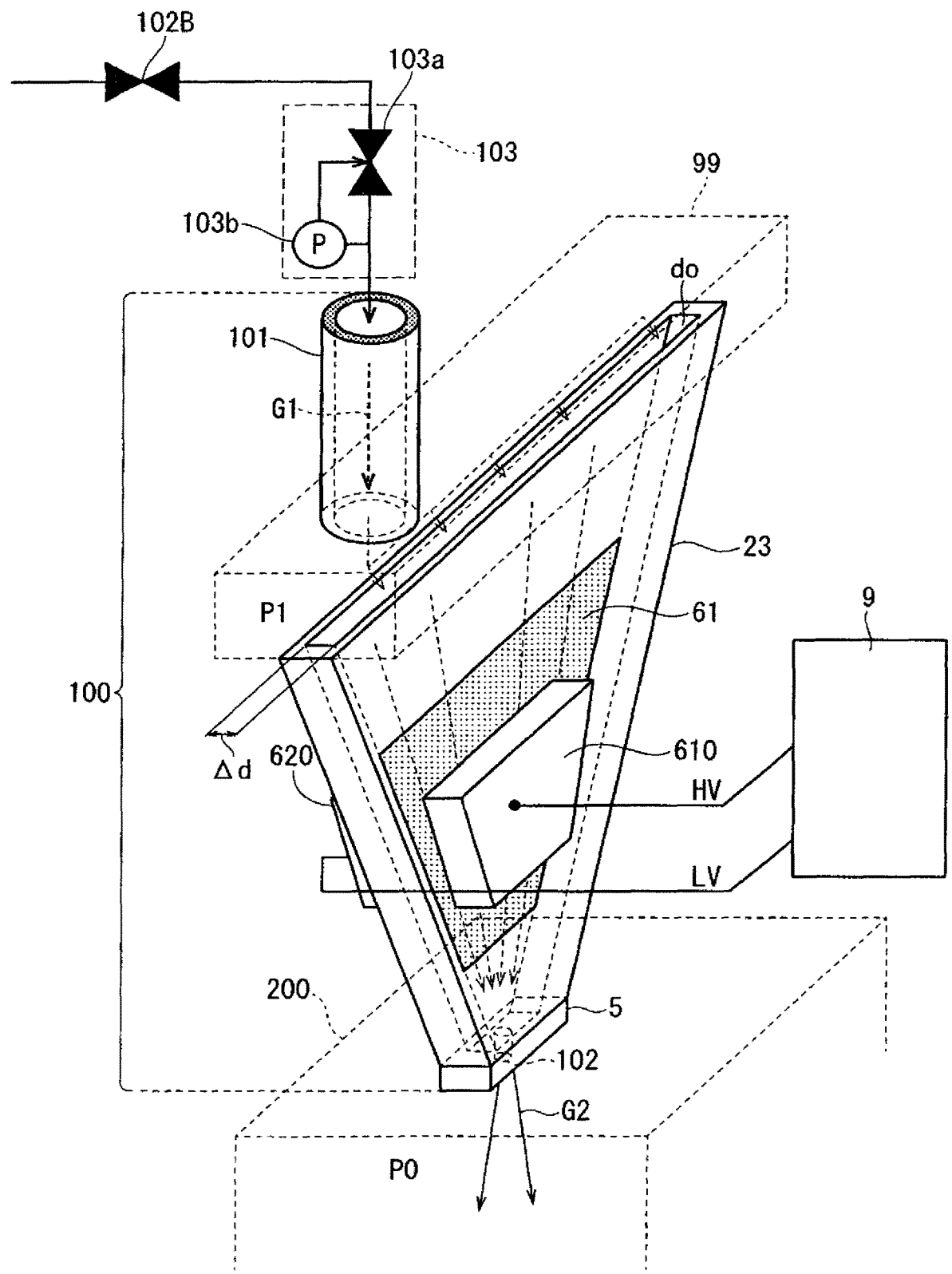
FIG. 5 is a perspective view schematically illustrating a configuration of a gas jetting apparatus 100 according to a third exemplary embodiment.

In a gas jetting apparatus 100 according to this exemplary embodiment, in a gas gap do of a gas jetting cell unit 23, dielectric barrier discharge is generated, and the dielectric barrier discharge is used to generate a high quality radical gas. The gas jetting cell unit 23 according to this exemplary embodiment jets out the radical gas in a beam shape having directivity at a higher velocity. FIG. 5 is a view illustrating a configuration of the gas jetting apparatus 100 according to this exemplary embodiment.

The gas jetting apparatus 100 described in the first exemplary embodiment and the gas jetting apparatus 100 according to this exemplary embodiment have identical configurations excluding that members described below are added.

Applying a higher AC voltage onto an electrode surface to generate dielectric barrier discharge, and then, utilizing the dielectric barrier discharge to allow a gas to dissociate to generate a radical gas is widely known. The gas jetting apparatus 100 according to this exemplary embodiment can be utilized as effective means capable of generating, through dielectric barrier discharge, and obtaining a high quality radical gas having significantly higher energy.

As shown in FIG. 5, the gas jetting cell unit 23 according to this exemplary embodiment includes two flat-plate, fan-shaped flat plates 2, 3. On the flat plate 2, a first electrode unit 61 is closely attached and provided, and, on the flat plate 3, a second electrode unit is closely attached and provided (the second electrode unit is not shown in FIG. 5 since the second electrode unit is provided at a back of the flat plate 3). On the first electrode unit 61, a power feeding plate 610 is provided, and, on the second electrode unit, a power feeding plate 620 is provided.

The gas jetting cell unit 23 according to this exemplary embodiment is a dielectric, and integrally formed of, for example, sapphire or quartz, where, inside the gas jetting cell unit 23, a sealed space is configured. Therefore, since, even if gas pressure in the gas jetting cell unit 23 is in a low pressure state, pressure in locations of the first electrode unit 61 and the second electrode unit provided outside the gas jetting cell unit 23 is atmospheric pressure, an insulation measure under atmospheric pressure can advantageously be designed against a high voltage applied by the first electrode unit 61.

In this exemplary embodiment, as shown in FIG. 5, the gas jetting apparatus 100 includes an AC power supply 9 for applying, via the power feeding plates 610, 620, an AC voltage between the first electrode unit 61 and the second electrode unit. In here, the first electrode unit 61 is a high potential HV side, while the second electrode unit is a low potential (ground potential) LV side.

The AC power supply 9 applies, via the power feeding plates 610, 620, a higher AC voltage between the first electrode unit 61 and the second electrode unit. In the gas gap do formed in the gas jetting cell unit 23 (which can be regarded as a discharge space), dielectric barrier discharge is generated. When a gas passes through the gap do in which the dielectric barrier discharge is generated, the gas electrolytic dissociates to generate a high quality radical gas having significantly higher energy. In here, in this exemplary embodiment, the gap do is a high electrical field, and is cold.

A gas G1 (e.g. nitrogen gas) supplied from a gas supply unit 101 uniformly disperses in the gas dispersion supply unit 99, and then enters into the gap do of the gas jetting cell unit 23. Inside the gap do in which dielectric barrier discharge is generated, the nitrogen gas G1 transmits. Through the dielectric barrier discharge, from the nitrogen gas being transmitted in the gap do, a nitrogen radical gas is generated. The nitrogen radical gas is supplied into the jetting-out unit 5. Via a jetting-out hole 102, the nitrogen radical gas G2 is jetted toward a treatment-target object. In here, as also described in the first exemplary embodiment, the jetting-out hole 102 jets out the nitrogen radical gas G2 in a beam shape having directivity at a higher velocity.

Although, in the above description, the configuration with the single jetting-out hole 102 is exemplified, a plurality of jetting-out holes 102 may be included.

As described above, in this exemplary embodiment, both main surfaces of the gas jetting cell unit 23 are provided with the two electrode units 61.

Therefore, when an AC voltage is applied in the gas gap do via the gas jetting cell unit 23 that is a dielectric, in the gas gap do, dielectric barrier discharge can be generated. Therefore, when a gas G1 is supplied into the gap do, a radical gas G2 can be generated in the gap do. From the gas jetting cell unit 23, the radical gas G2 is output in a beam shape having directivity. In here, as also described in the first exemplary embodiment, the gas transmitted in the gap do is rectified and accelerated. Therefore, the gas jetting cell unit 23 outputs the beamed radical gas G2 at a higher velocity. Therefore, a time required by the radical gas G2 to reach a treatment-target object is shortened, and, while its high density is maintained, the radical gas G2 is radiated onto the treatment-target object.

In here, to remove discharge heat generated through dielectric barrier discharge, although not shown, the power feeding plates 610, 620 may internally be provided with flow channels into which a refrigerant circulates. By allowing a refrigerant such as water to circulate in the flow channels, two electrodes 61 and the gas jetting cell unit 23 can be cooled via the cooled power feeding plates 610, 620. In the discharge space in the cooled gas gap do, a further high quality radical gas is generated.

To use dielectric barrier discharge to generate a high quality radical gas, a plasma state in the gas gap do should be a higher electrical field. To achieve a plasma state in a higher electrical field, a product of P·d (kPa·cm) is required to satisfy a condition of a predetermined value or lower. In here, P represents gas pressure in the gap do (which can be regarded as gas pressure P1 described above), while d represents a width of the gap do (which can be regarded as Δd described above).

In a case of a radical gas, if a product of P·d results in an identical value, between a condition of atmospheric pressure+shorter gap length (smaller width Δd) (referred to as a former) and a condition of decompression+longer gap length (larger width Δd) (referred to as a latter), the latter is advantageous in terms of points shown below. That is, in the case of the latter, a flow velocity of a gas flowing into the gap do can be increased, and a gap length (a wall of a discharge surface) extends, thus a loss due to an amount of collisions of a radical gas onto the wall can be reduced (i.e. decomposition in the generated radical gas amount (radical gas density) can be reduced).

As described above, in a view point of stably driving dielectric barrier discharge to obtain a fine radical gas, the inventors have found that the gas jetting cell unit 23 should advantageously satisfy conditions shown below.

That is, in the gas jetting apparatus 100, it is advantageous that gas pressure P1 is set to a value in a range from approximately 10 kPa to 30 kPa inclusive, and a width Δd of the gap do is set to a value in a range from approximately 0.3 to 3 mm inclusive, to obtain a value of a product of P·d in a range from approximately 0.3 to 9 (kPa·cm) inclusive. By setting the gas pressure P1 and the width Δd in the ranges of the values, a field intensity of dielectric barrier discharge can be increased to generate a high quality radical gas.

In this exemplary embodiment, similar to the first exemplary embodiment, at the previous stage of the gas jetting apparatus 100, the valve 102B and the APC 103 are provided. In this exemplary embodiment, if gas pressure in the gas jetting apparatus 100 falls outside a predetermined range, dielectric barrier discharge cannot be generated, or abnormal discharge is generated. Therefore, in this exemplary embodiment, in a view point of such problems, provision of the valve 102B and the APC 103 is important to maintain pressure in the gas jetting apparatus 100 to a constant value. In addition, in the APC 103, a configuration may be adopted where, if a pressure abnormality is detected in the gas jetting apparatus 100, the APC 103 sends an electric signal to immediately stop the discharging power supply 9.

In the above description, as an example, a case where, as a gas G1, a nitrogen gas is adopted is described. However, instead of a nitrogen gas, a nitrogen compound gas may be adopted. In addition, as a gas G1 to be supplied to the gap do of the gas jetting cell unit 23, an oxygen compound gas (including an oxygen gas and ozone), a hydrogen compound gas (including a hydrogen gas), and another similar gas may be adopted. In this case, in the gap do, due to electrolytic dissociation, an oxygen radical gas is generated from the oxygen compound gas, while a hydrogen radical gas is generated from the hydrogen compound gas.

In particular, when an oxygen gas is supplied to the gas jetting apparatus 100, for the oxygen gas to be supplied, a very small amount of a nitrogen gas or a nitrogen oxide gas is added (in a range from several ten ppm to several ten thousand ppm). When dielectric barrier discharge is generated, with a catalytic action of a generated nitrogen oxide, an amount of an oxygen radical gas to be generated can be significantly increased. As a result, quality in forming an oxide film and a film formation rate can be improved.

When an oxygen gas to be supplied is added with a very small amount of a nitrogen gas or a nitrogen oxide gas, from the added nitrogen gas or the nitrogen oxide gas, due to discharge, a nitric acid gas is also generated. In the film formation apparatus 200, when the generated nitric acid gas comes into contact with a metallic part in the apparatus 200, metallic contamination occurs. Therefore, in a view point of preventing metallic contamination from occurring as much as possible, it is advantageous that an amount of nitrogen to be added in an oxygen gas is in particular at a maximum of 1000 ppm.

When an oxygen radical gas G2 is radiated from the gas jetting cell unit 23 toward the treatment-target object, an oxide film is formed, while, when a hydrogen radical gas G2 is radiated, a hydrogen reduction film (a metallic film in which hydrogen bonding is facilitated) is formed.

Fourth Exemplary Embodiment

In this exemplary embodiment, a plurality of the gas jetting cell units 23 described in the first exemplary embodiment is provided in a gas jetting apparatus 100.

Figure 6:
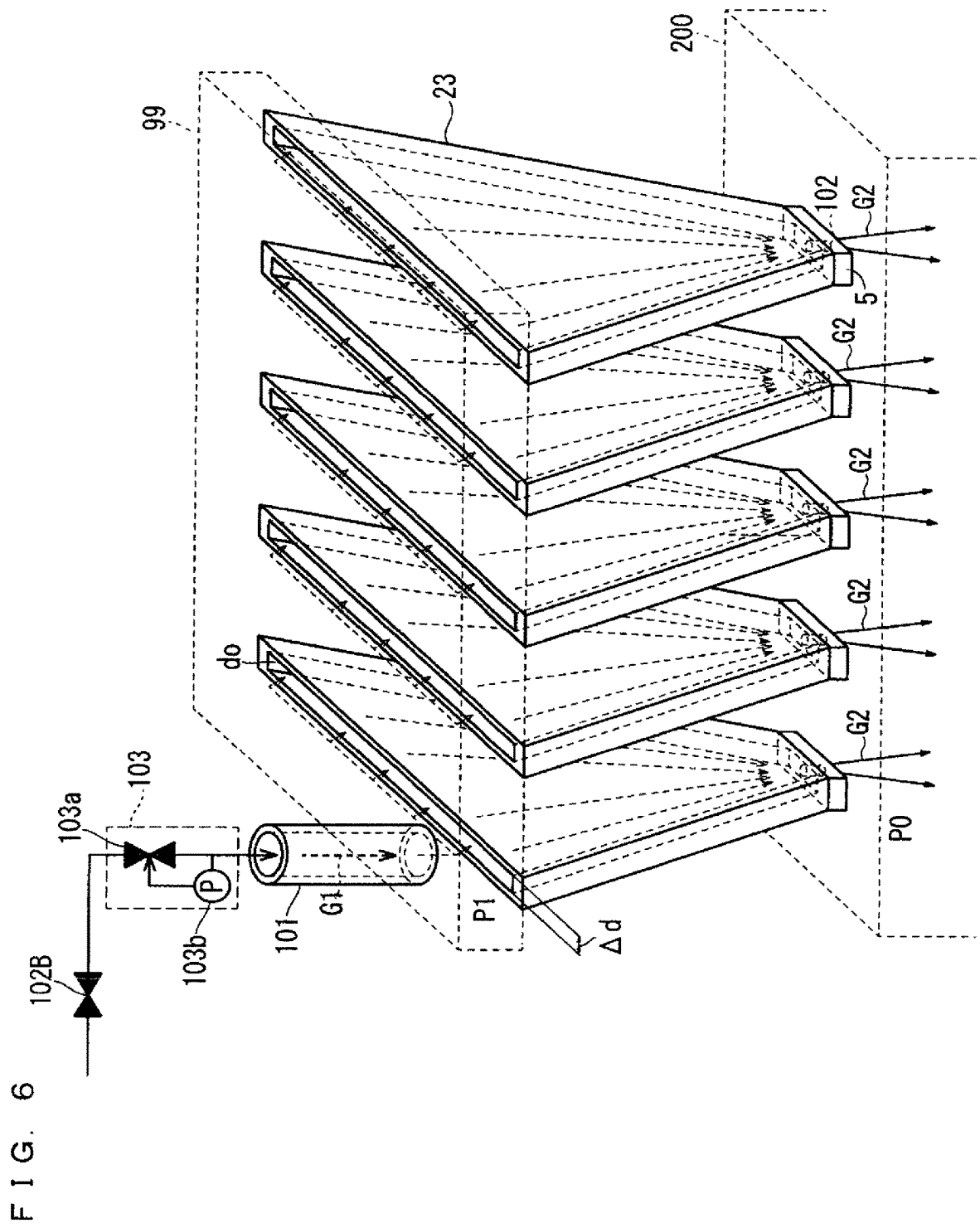
FIG. 6 is a perspective view schematically illustrating a configuration where a single film formation apparatus is provided with a plurality of gas jetting cell units 23.

FIG. 6 is a perspective view schematically illustrating a configuration of a remote plasma type film formation treatment system configured to include a gas jetting apparatus 100 including the plurality of gas jetting cell units 23 and a treatment chamber (film formation apparatus) 200. In the gas jetting apparatus 100 shown in FIG. 6, a gas G2 is jetted out, via jetting-out holes 102, into the film formation apparatus 200.

As shown in FIG. 6, the plurality of gas jetting cell units 23 described in the first exemplary embodiment is provided between a single gas dispersion supply unit 99 and the single film formation apparatus 200. In this exemplary embodiment, pressure outside the gas jetting apparatus 100 is atmospheric pressure. In addition, excluding a quantity of the gas jetting cell units 23, the configurations of the first exemplary embodiment and FIG. 6 are identical.

Figure 7:
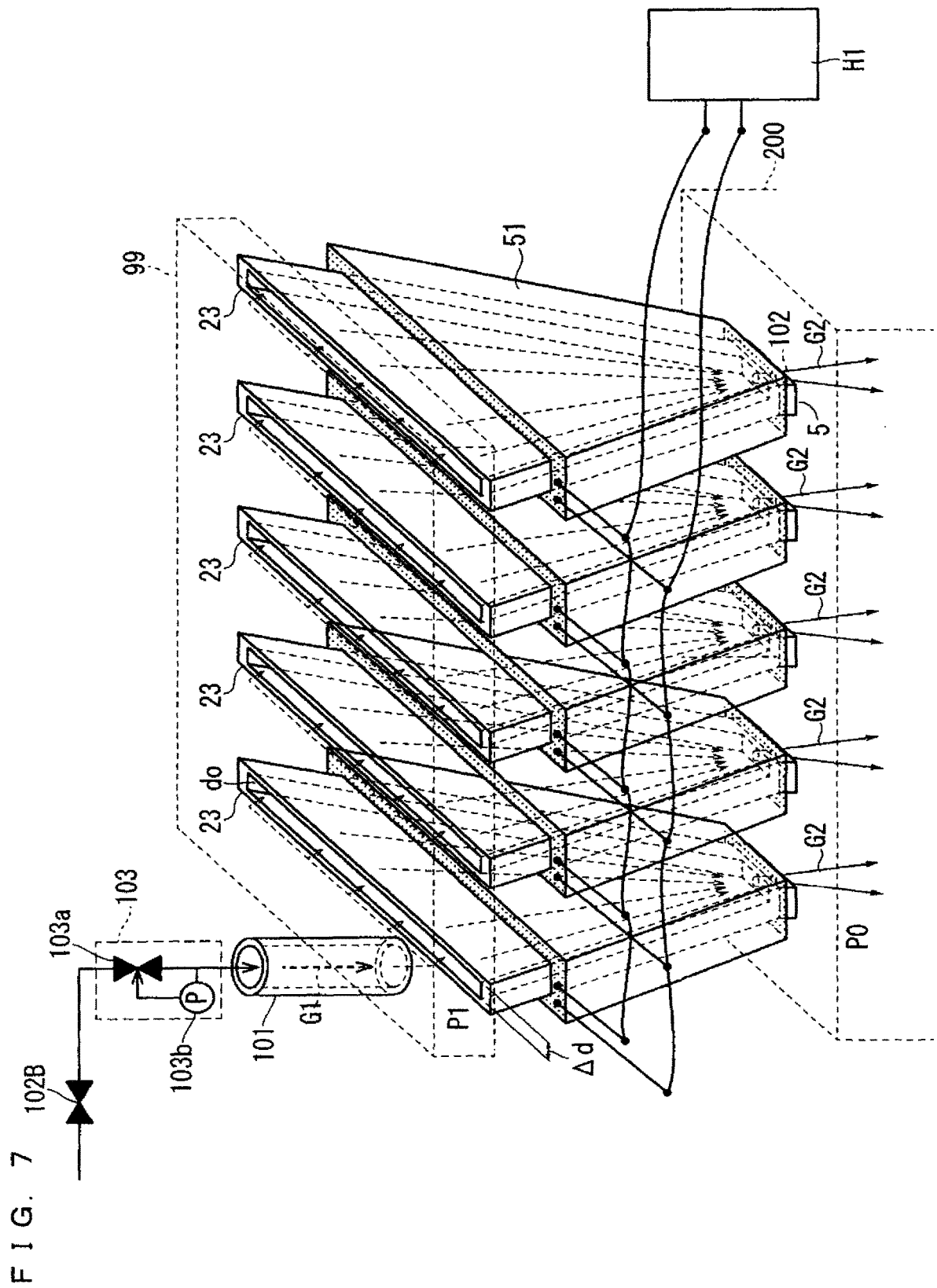
FIG. 7 is a perspective view schematically illustrating another configuration where a single film formation apparatus is provided with a plurality of gas jetting cell units 23.

FIG. 7 is a perspective view schematically illustrating another configuration of the gas jetting apparatus 100 according to this exemplary embodiment. In the gas jetting apparatus 100 shown in FIG. 7, a gas G2 is jetted out, via jetting-out holes 102, into the film formation apparatus 200.

As shown in FIG. 7, the plurality of gas jetting cell units 23 described in the second exemplary embodiment is provided between a single gas dispersion supply unit 99 and the single film formation apparatus 200. In this exemplary embodiment, pressure outside the gas jetting apparatus 100 is atmospheric pressure. In addition, excluding a quantity of the gas jetting cell units 23, the configurations of the second exemplary embodiment and FIG. 7 are identical.

Figure 8:
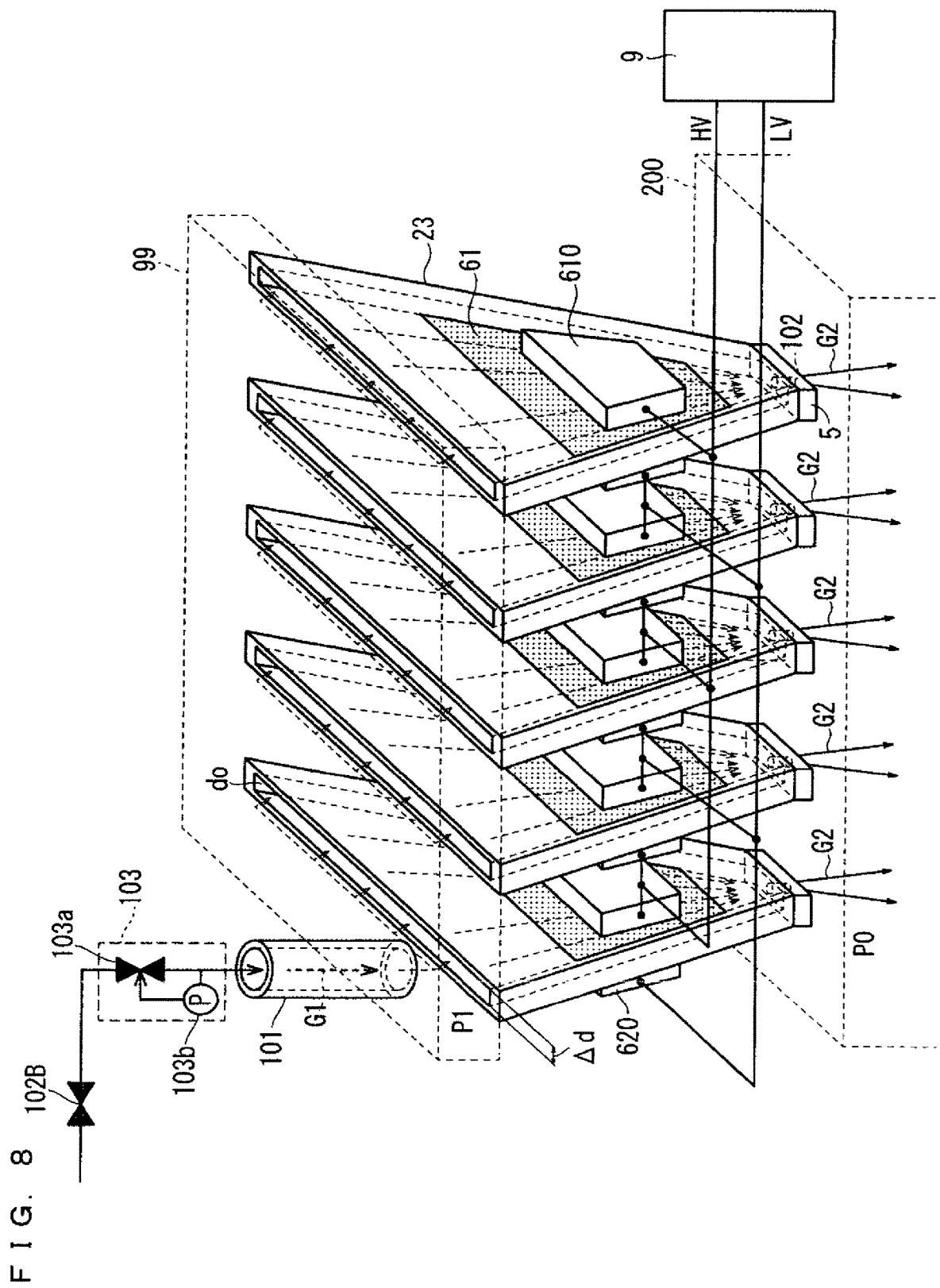
FIG. 8 is a perspective view schematically illustrating still another configuration where a single film formation apparatus is provided with a plurality of gas jetting cell units 23.

FIG. 8 is a perspective view schematically illustrating still another configuration of the gas jetting apparatus 100 according to this exemplary embodiment. In the gas jetting apparatus 100 shown in FIG. 8, a gas G2 is jetted out, via jetting-out holes 102, into the film formation apparatus 200.

As shown in FIG. 8, the plurality of gas jetting cell units 23 described in the third exemplary embodiment is provided between a single gas dispersion supply unit 99 and the single film formation apparatus 200. In this exemplary embodiment, pressure outside the gas jetting apparatus 100 is atmospheric pressure. In addition, excluding a quantity of the gas jetting cell units 23, the configurations of the third exemplary embodiment and FIG. 8 are identical.

Typically, the film formation apparatus 200 includes a portion for supplying a precursor, and a portion for supplying a gas corresponding to a required film type, such as an oxide film and a nitride film. To this end, for a single film formation apparatus 200, a first gas jetting apparatus 100 for jetting a non-heated gas, which corresponds to the portion for supplying a precursor (the gas jetting apparatus 100 shown in FIG. 6), and a second gas jetting apparatus 100 for jetting a heated gas or a discharge gas, which corresponds to the portion for supplying a gas corresponding to a required film type, such as an oxide film and a nitride film (the gas jetting apparatus 100 shown in FIG. 7 or 8) may be combined and coupled. In here, in the first gas jetting apparatus 100 for jetting a non-heated gas, a plurality of gas jetting cell units 23 for jetting a precursor gas is provided. In addition, in the second gas jetting apparatus 100 for jetting a heated gas or a discharge gas, a plurality of gas jetting cell units 23 for jetting a radical gas is provided.

Configurations of remote plasma type film formation treatment systems include a sheet-fed type where a treatment-target object is placed in a film formation apparatus 200, and a batch type where a plurality of treatment-target objects are placed. To supply a precursor gas into a film formation apparatus 200, the plurality of gas jetting cell units 23 shown in FIG. 6 is used for supply, while, to supply a source gas of an activation gas as a nitriding agent or an oxidizing agent, the plurality of gas jetting cell units 23 shown in FIGS. 7, 8 is used for supply. Therefore, on a surface of a three dimensional function element (3D element) onto which a plurality of function elements is formed in a multi-layer manner, which is a treatment-target object, a nitride film or an oxide film can uniformly be formed.

In FIGS. 6, 7, and 8, the plurality of gas jetting cell units 23 is uniformly arranged, and a gas uniformly dispersed in the gas dispersion supply unit 99 uniformly enters into the gas jetting cell units 23.

Fifth Exemplary Embodiment

Figure 9:
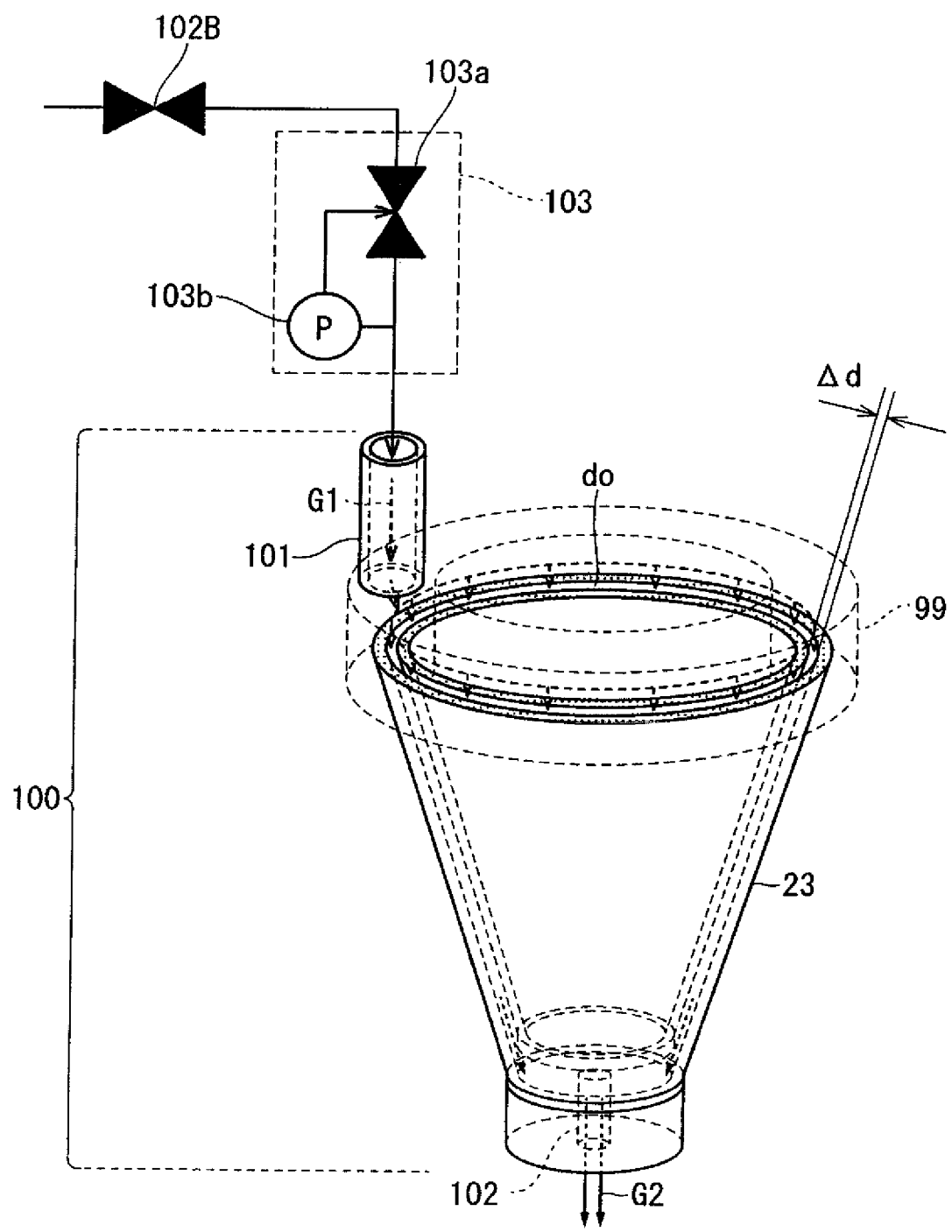
FIG. 9 is a perspective view schematically illustrating a configuration of a remote plasma type film formation treatment system configured to include a gas jetting apparatus 100 and a treatment chamber 200 according to a fifth exemplary embodiment.

In this exemplary embodiment, as shown in FIG. 9, a gas jetting apparatus 100 includes a cone-shaped gas jetting cell unit 23 disposed with two coaxial, cone-shaped members forming a gas gap M. By allowing a gas G2 to be jetted out from a peak portion of the cone-shaped gas jetting cell unit 23, the gas can be jetted out in a beam shape in a similar manner, thus high quality film formation can be achieved.

The invention claimed is:

1. A gas jetting apparatus for a film formation apparatus, comprising:
   a gas supply unit configured to supply a gas;
   a gas dispersion supply unit configured to accept the gas supplied from the gas supply unit and disperse the gas; and
   a gas jetting cell unit configured to accept the gas dispersed in the gas dispersion supply unit, rectify the gas, and jet the rectified gas into the film formation apparatus, wherein
   the gas jetting cell unit has a fan shape internally formed with a gap serving as a hollow gas route,
   the gas in the gas dispersion supply unit enters from a wider-width side of the fan shape into the gap, due to the fan shape, the gas is rectified, accelerated, and output from a narrower-width side of the fan shape into the film formation apparatus, the gap includes a rectangular cross-section when viewed along a direction extending from the wider-width side to the narrower-width side, a first distance between first and second sides of the rectangular cross-section is constant from the wider-width side to the narrower-width side, and a second distance between third and fourth sides of the rectangular cross-section decreases from the wider-width side to the narrower-width side.

2. The gas jetting apparatus for the film formation apparatus, according to claim 1, wherein the gas jetting cell unit is made of sapphire or quartz.

3. The gas jetting apparatus for the film formation apparatus, according to claim 1, wherein the first distance is 3 mm or narrower, and a gas pressure in a portion of the gas jetting apparatus is a value in a range from 10 kPa to 50 kPa inclusive.

4. The gas jetting apparatus for the film formation apparatus, according to claim 1, wherein a valve for adjusting a gas flow rate is coupled with a pressure controlling unit for controlling gas pressure in the gas jetting apparatus to a constant value.

5. The gas jetting apparatus for the film formation apparatus, according to claim 1, further comprising a plurality of jetting-out holes, wherein a gas output from the gas jetting cell unit outputs, via the plurality of jetting-out holes, into the film formation apparatus.

6. The gas jetting apparatus for the film formation apparatus, according to claim 1, further comprising a heating unit provided in the gas jetting cell unit.

7. The gas jetting apparatus for the film formation apparatus, according to claim 6, wherein, with the gas jetting cell unit:

an ozone gas, a nitrogen oxide gas, or a hydrogen compound gas is used to serve as a gas passing through the gap, the gas passing through the gap is oxygen-radicalized, nitrogen-radicalized or hydrogen-radicalized as a radicalized gas by heating by the heating unit, and the radicalized gas is output to the film formation apparatus.

8. The gas jetting apparatus for the film formation apparatus, according to claim 6, wherein the heating unit is fan shaped.

9. The gas jetting apparatus for the film formation apparatus, according to claim 1, wherein the gas jetting cell unit is a dielectric, the gas jetting apparatus further comprises an AC power supply configured to apply an AC voltage in the gap in the gas jetting cell unit, and the gas jetting cell unit outputs a radical gas generated through dielectric barrier discharge generated in the gap with the AC voltage applied by the AC power supply to the film formation apparatus.

10. The gas jetting apparatus for the film formation apparatus, according to claim 9, wherein a gas to be supplied from the gas supply unit is a nitrogen gas or a nitrogen oxide gas, and the radical gas to be generated through the dielectric barrier discharge in the gap of the gas jetting cell unit is a nitrogen radical.

11. The gas jetting apparatus for the film formation apparatus, according to claim 9, wherein a gas to be supplied from the gas supply unit is a gas mixed with an oxygen gas and a nitrogen gas or a nitrogen oxide gas in an amount in a range from several ppm to several ten thousand ppm, and the radical gas to be generated through the dielectric barrier discharge in the gap of the gas jetting cell unit is an oxygen radical.

12. The gas jetting apparatus for the film formation apparatus, according to claim 1, wherein the gas jetting cell unit is provided in plural.

13. The gas jetting apparatus for the film formation apparatus, according to claim 1, wherein a gas to be supplied from the gas supply unit is a precursor gas.

14. The gas jetting apparatus for the film formation apparatus, according to claim 1, wherein a gas to be supplied from the gas supply unit is a source gas served as a raw material of a radical gas.

* * * * *